(12) United States Patent
Fragner et al.

(10) Patent No.: US 8,222,621 B2
(45) Date of Patent: Jul. 17, 2012

(54) METHOD FOR MASKLESS PARTICLE-BEAM EXPOSURE

(75) Inventors: Heinrich Fragner, Vienna (AT); Elmar Platzgummer, Vienna (AT); Robert Nowak, Vienna (AT); Adrian Bürli, Zurich (CH)

(73) Assignee: IMS Nanofabrication AG, Vienna (AT)

( * ) Notice: Subject to any disclaimer, the term of this patent is extended or adjusted under 35 U.S.C. 154(b) by 429 days.

(21) Appl. No.: 12/619,480

(22) Filed: Nov. 16, 2009

(65) Prior Publication Data

US 2010/0127185 A1    May 27, 2010

(30) Foreign Application Priority Data

Nov. 17, 2008 (EP) .................................... 08450184

(51) Int. Cl.
*G21K 5/10* (2006.01)
*H01J 37/08* (2006.01)
(52) U.S. Cl. .............. 250/492.22; 250/492.21; 250/398; 250/396 R; 430/5; 430/30; 430/296; 430/396; 430/397; 430/942
(58) Field of Classification Search ............. 250/492.22, 250/492.21, 396 R, 398
See application file for complete search history.

(56) References Cited

U.S. PATENT DOCUMENTS

| | | | |
|---|---|---|---|
| 5,103,101 A | 4/1992 | Berglund | |
| 5,369,282 A | 11/1994 | Arai et al. | |
| 6,768,123 B2 | 7/2004 | Giering | |
| 6,768,125 B2 * | 7/2004 | Platzgummer et al. | .. 250/492.22 |
| 7,276,714 B2 * | 10/2007 | Platzgummer et al. | .. 250/492.22 |
| 2005/0242303 A1 | 11/2005 | Platzgummer | |
| 2008/0237460 A1 * | 10/2008 | Fragner et al. | ................ 250/307 |

OTHER PUBLICATIONS

European Search Report for Application 09450211.9-1226; report dated Sep. 14, 2010; 4 pgs.
Berry et al., "Programmable aperture plate for maskless high-throughput nanolithography", J. Vac. Sci. Technol., Nov./Dec. 1997, vol. B15, No. 6, pp. 2382-2386.

\* cited by examiner

*Primary Examiner* — Jack Berman
*Assistant Examiner* — Meenakshi Sahu
(74) *Attorney, Agent, or Firm* — Kauth, Pomeroy, Peck & Bailey LLP

(57) ABSTRACT

In a maskless particle multibeam processing apparatus, a particle beam is projected through a pattern definition system producing a regular array of beamlets according to a desired pattern, which is projected onto a target which moves at continuous speed along a scanning direction with respect to the pattern definition system. During a sequence of uniformly timed exposure steps the beam image is moved along with the target along the scanning direction, and between exposure steps the location of the beam image is changed with respect to the target. During each exposure step the target covers a distance greater than the mutual distance of neighboring image elements on the target. The location of the beam image at consecutive exposure steps corresponds to a sequence of interlacing placement grids, and after each exposure step the beam image is shifted to a position associated with a different placement grid, with a change of location generally including a component across the scanning direction, thus cycling through the set of placement grids.

9 Claims, 5 Drawing Sheets

METHOD FOR MASKLESS PARTICLE-BEAM EXPOSURE

RELATED APPLICATIONS

This application claims priority under 35 U.S.C. §119 to European patent application number 08450184.0 filed Nov. 17, 2008, the disclosure of which is incorporated herein by reference in its entirety.

FIELD OF THE INVENTION

The present invention relates to a method for forming a pattern on a surface of a target by means of a beam of electrically charged particles. More in detail, embodiments of the invention can include the steps of: producing said particle beam; directing said particle beam through a pattern definition means comprising an aperture array having a plurality of regularly arranged apertures of identical shape, thus producing a number of beamlets by means of said apertures which define the shape and relative position of said beamlets, including modifying the direction of selected beamlets by means of a blanking array means of the pattern definition means to respective paths which do not meet the target, thus effectively switching off the passage of said selected beamlets, so the remaining beamlets form, as a whole, a patterned particle beam; and projecting this patterned particle beam by means of an optical column comprising a controllable deflection means onto said target surface to form a beam image composed of the images of the apertures whose beamlets are not switched off. Each aperture thus corresponds to an image element on the target surface, while the target is moving relative to the pattern definition means along a scanning direction within an image plane in which the images of apertures are formed (or, in a direction generally perpendicular to a propagation direction of the patterned beam). During a sequence of uniformly timed exposure steps the location of said beam image is, by means of said controllable deflection means, moved along with the target at least with respect to the target movement along the scanning direction, and between exposure steps the location of the beam image is changed with respect to the target. The exposure steps each have a duration within which the relative movement of the target covers a uniform distance of advance which is greater than the mutual distance of neighboring image elements on the target.

A maskless particle multibeam processing apparatus of this kind is disclosed in DE 10 2008 015 305 A1=US 2008/0237460 A1 of the applicant/assignee as discussed in the following.

BACKGROUND OF THE INVENTION

Processing of planar targets by means of electrically charged particles has been investigated since the 1980s. One important application of particle-beam lithography is in semiconductor technology. Therein, lithography apparatus are used to define structures on a target, e.g., a silicon wafer. (Throughout this disclosure, the terms target and substrate are used interchangeably.) In order to define a desired pattern on a substrate wafer, the wafer is covered with a layer of a radiation sensitive photoresist. Afterwards, a desired structure is imaged onto the photoresist by means of a lithography apparatus, and the photoresist is then patterned by partial removal according to the pattern defined by the previous exposure step and then used as a mask for further structuring processes such as etching. In another important application the pattern may be generated by direct patterning without a resist, for example ion milling or reactive ion beam etching or deposition.

In a maskless multibeam apparatus, the feature shapes are defined by means of a beamlet array on a target through the amount of exposure dose imparted to each pixel. Each beamlet is switched on or off according to a desired pattern, and the beamlets are moved over the target. In the course of subsequent exposure steps, the desired layout is composed on the target. For instance, with a resist-based method, if a pixel receives an exposure dose exceeding the (given) resist-development threshold, that pixel is exposed; otherwise the pixel is not exposed. The feature shape is thus defined by the spatial distribution of exposed and non-exposed pixels.

The layout data is usually generated in polygonal structures. For the exposure of resist images by means of a maskless pattern writing tool the layout data is converted into a pixel image data (rasterization). Therefore, the technology for maskless took requires specific methods for data preparation. One feature of the maskless tool concept is that each pixel requires the same amount of time regardless of whether it is exposed or not.

The number of pixels required to obtain a sufficiently good feature resolution at standard chip sizes is quite high and remains a challenging task. Therefore, the storage of the complete rasterized image data is not feasible. Instead, the layout data are processed in an online rasterization which employ simple algorithms, which take only short runtime. These algorithms will also have to provide the capability to reduce or even eliminate the effects of possible defects on the APS, in particular so-called always-closed and/or always-open failures.

In 1997, I. L. Berry et al., in J. Vac. Sci. Technol. B, 15(6), 1997, pp. 2382-2386, presented a writing strategy based on a blanking aperture array and an ion projection system. Arai et al., in U.S. Pat. No. 5,369,282, discuss an electron beam exposure system using a so called blanking aperture array (BAA) which plays the role of a pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner to that the apertures form staggered lines as seen along the scanning direction. Thus, the staggered lines sweep continuous lines on the substrate surface without leaving gaps between them as they move relative to the substrate, thus covering the total area to be exposed on the substrate.

Starting from Berry's concept, E. Platzgummer et al., in U.S. Pat. No. 6,768,125, presented a multi-beam direct write concept dubbed PML2 (short for "Projection Maskless Lithography"), employing a pattern definition device comprising a number of plates stacked on top of the other, among them an aperture array means and a blanking means. These separate plates are mounted together at defined distances, for instance in a casing. The aperture array means has a plurality of apertures of identical shape defining the shape of beamlets permeating said apertures, wherein the apertures are arranged within a pattern definition field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the U.S. Pat. No. 6,768, 125 with regard to the architecture and operation of the pattern definition device is hereby included as part of this disclosure by reference.

The PML2 multi-beam direct write concept allows for a large enhancement of the writing speed compared to single beam writers. This arises from the reduction of the required current density, the diminished importance of space charge due to the large cross section, the enhanced pixel transfer rate due to the parallel writing strategy, and the high degree of redundancy possible using a plurality of beams.

The U.S. Pat. No. 7,276,714 of the applicant/assignee discloses a pattern definition means for particle beam processing, comprising at least an aperture plate and blanking means. The apertures in the aperture plate are arranged in "interlocking grids", wherein the apertures are arranged in groups in squares or rectangles whose basic grids are meshed together. This means that the positions of the apertures taken with respect to a direction perpendicular to a scanning direction and/or parallel to it are offset to each other by not only multiple integers of the effective width of an aperture, as taken along said direction, but also by multiple integers of an integer fraction of said effective width. In this context, "scanning direction" denotes the direction along which the image of the apertures formed by the charged-particle beam on a target surface is moved over the target surface during an exposure process.

The "interlocking grids"-solution allows a finer resolution on the target surface even though the individual spots formed by each image of an individual aperture are not decreased in size. Particular values of the fractional offsets are integer multiples of $\frac{1}{2}^K$ times the effective width of an aperture, where K is a positive integer.

Furthermore, the U.S. Pat. No. 6,768,125 and U.S. Pat. No. 7,276,714 describe the generation of grey scales by subsequent exposures of one pixel on the target by multiple apertures located in line. Thus, a shift register approach can be effectively applied to create grey scale patterns, i.e., exposure levels interpolated between a minimal ('black') and maximal ('white') exposure dose.

The state-of-the-art PML2 concept is a strategy where the substrate is moved continuously, and the projected image of a structured beam generates 100 percent of the grey pixels by subsequent exposures of apertures located in line. To realize grey levels, the total amount of apertures in line is subdivided into columns, the number of columns corresponding to the number of desired grey levels. In a recent variant described in the DE 10 2008 015 305 A1=US 2008/0237460 A1 by the applicant/assignee, a so called "trotting mode" writing strategy is proposed in which for each pixel one or a few beams along the (mechanical) scanning direction are used to generate the entire set of the grey pixels. The advantage of this variant is the reduced complexity of the CMOS structure and improved data management.

The particle optical system is generally non-ideal, which means that the system has imaging defects, in particular image distortions and blur variations, which additionally may very over time, temperature and image position. In order to account for these imaging defects, rasterization algorithms are desired which can provide blur-independent writing possibilities and/or the capability to include an image pre-distortion, which is designed to compensate for optical distortions. Additionally the beam deflection angles shall be kept low to keep the distortion effects of the optical system also low.

However, the "trotting mode" method according to the above mentioned patent application has some very specific requirements on the APS layout, in particular with regard to the order of interlocking (i.e., over sampling), the order of the redundancy and the size of the aperture, which directly impacts on the aperture layout. A change of one of these parameters is generally not possible without altering the layout of the blanking plate.

It is an objective of the present invention to improve the "trotting mode" writing strategy so as to simplify the imaging strategy and further allow a simple mapping from polygonal structures to grey level data that are independent of the actual blur.

SUMMARY OF THE INVENTION

This objective is met by a method as described in the beginning, wherein the location of the beam image at consecutive exposure steps is given by image positions, which each correspond to a position on one of a set of regular placement grids, wherein with each change of location of the beam image between exposure steps, the beam image is shifted to an image position associated with a different placement grid, thus cycling through the entire set of placement grids, said change of location additionally comprising a longitudinal component which is generally uniform. These placement grids are congruent and identically oriented but each has a different placement offset within the image plane, the placement offset between any two placement grids being not greater than the mutual distance of neighboring image elements on the target, at least some of the placement offsets being oblique or perpendicular (i.e., clearly non-parallel) to the scanning direction. The longitudinal component of a change of location is parallel to the scanning direction and has a length which is a fraction of the width of the beam image as measured along the scanning direction and generally compensating the movement of the location of the beam image between consecutive exposure steps with regard to the location of the pattern definition means.

This solution according to the invention modifies the "trotting mode" method so as to make it more flexible and allowing an additional redundancy scheme in order to limit the influence of always open or always closed apertures. The invention is based on allowing transverse shifts of the beam image on the target, as opposed to the concept of the "trotting mode" method. In a particular aspect of the invention, after each exposure step the beam image is shifted to a different exposure position wherein the beam image, as a whole, is interlacing with the beam image at the previous position while no position of a beamlet coincides with the position of a beamlet within the beam image of the previous position. This concept is compatible with the motion of the target going on during the exposure, but at the same time allows "swinging" the image aside from the overall linear part just as much as needed to continuously cover the complete die area on the target.

Moreover, the invention provides for additional refinements of compensating defects on the aperture plate as well as compensating optical errors by pixel interpolation.

In a further development of the invention, a perpendicular redundancy can be realized, namely by changing, within an exposure step, the location of the beam image between locations belonging to the same replacement grid. The changes of location within an exposure step may, in particular, done at regular time intervals, shifting the location of the beam to a location different from the previous locations in the respective exposure step. If possible, the changes of location within an exposure step may be done perpendicular to the scanning direction.

Furthermore, the invention is suitable for a simplified aperture array arrangement in the pattern definition means, wherein the regular arrangement of the apertures comprises lines of apertures running parallel to the scanning direction, and neighboring lines of apertures are offset from each other by an offset greater that the width of the apertures taken perpendicular to the scanning direction.

In a particular aspect of the invention the arrangement of each placement grid geometrically corresponds with the regular arrangement of the apertures in the pattern definition means as projected onto the target, and within each exposure step the images of the apertures positionally coincide with a portion of one of said placement grids.

In an advantageous layout of the invention the sum of consecutive changes of location of the beam image, summed over one cycle through said set of placement grids, is parallel to the scanning direction.

Preferably, the distance of advance is greater than the mutual distance of neighboring aperture images on the target as taken along the scanning direction.

BRIEF DESCRIPTION OF THE DRAWINGS

In the following, the present invention is described in more detail with reference to the drawings, which show.

DETAILED DESCRIPTION OF THE INVENTION

The preferred embodiment of the invention discussed in the following is a development from the PML2-type particle-beam exposure apparatus with a pattern definition (PD) system as disclosed in U.S. Pat. No. 6,768,125 and U.S. Pat. No. 7,276,714 of the assignee/applicant, and with a large-reduction projecting system. In the following, first the technical background of the apparatus is discussed—as far as relevant to the invention—, then the invention is presented in detail.

It should be appreciated that the invention is not restricted to the following embodiments or the particular layout of the PD-system, which merely represent one of the possible applications of the invention; the invention is suitable for other types of processing systems that employ a particle-beam with projector stages as well.

Maskless Particle-Beam Processing Apparatus

Figure 1:
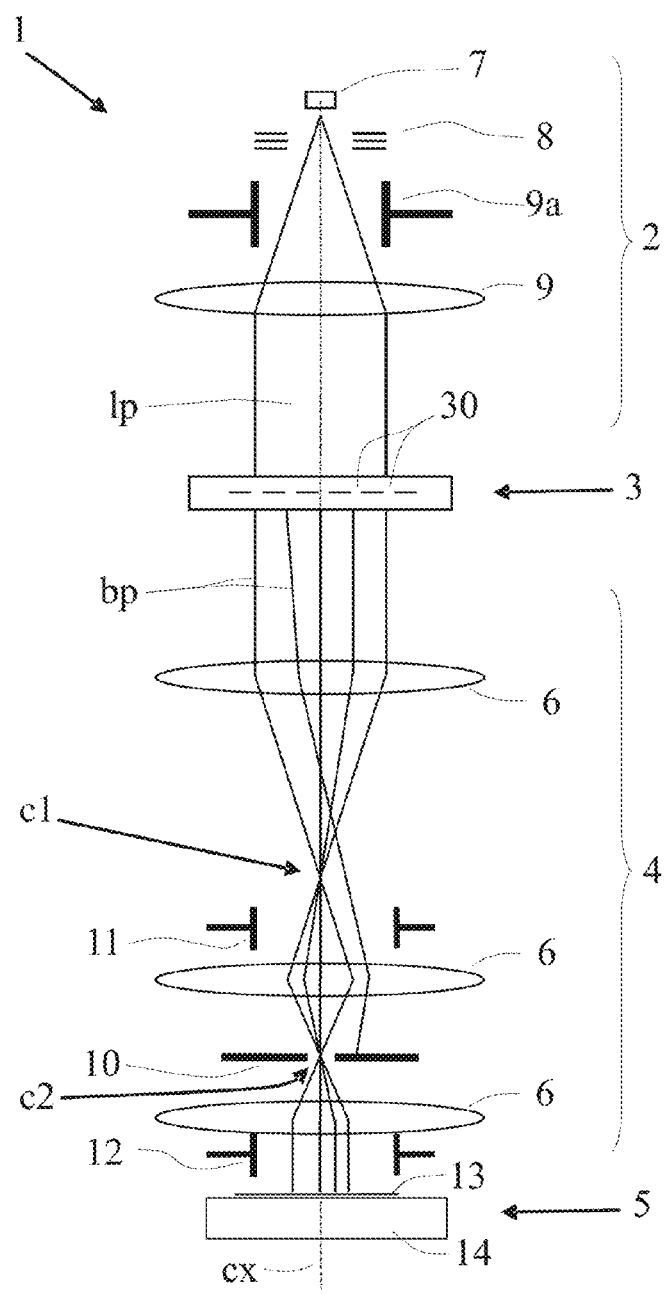
FIG. 1 shows a schematic overview of a particle-beam exposure apparatus according to prior art in a longitudinal section, but suitable for the invention.

FIG. 1 shows a schematic overview of a maskless particle-beam processing apparatus PML2 which itself is known from prior art but is suitable to embody the present invention. The components are not shown to size; in particular, the lateral width of the particle beam lb, pb is exaggerated. In the following, only those details are given as needed to disclose the invention. For more details, the reader is referred to U.S. Pat. No. 6,768,125 and U.S. Pat. No. 7,276,714.

The main components of the lithography apparatus 1—corresponding to the direction of the lithography beam lb, pb which in this example runs vertically downward in FIG. 1—are an illumination system 2, a PD system 3, a projecting system 4 and a target station 5 with a substrate 13 which is held and positioned by a wafer stage 14. The whole apparatus is contained in a vacuum housing (not shown) held at a high vacuum to ensure an unimpeded propagation of the beam lb, pb along the optical axis cx of the apparatus. The optical systems 2, 4 are realized using electrostatic or electromagnetic lenses which are depicted symbolically by reference numbers 6.

The illumination system 2 comprises, for instance, an electron gun 7, an extraction system 8 as well as a condenser lens system 9. A general blanking deflector 9a may be present as well. It should, however, be noted that in place of electrons, in general, other electrically charged particles can be used as well. Apart from electrons these can be, for instance, hydrogen ions or heavier ions, charged atom clusters, or charged molecules. In the context of this disclosure "heavier ions" refer to ions of elements heavier than C, such as O, N, or the noble gases Ne, Ar, Kr, Xe.

By means of the condenser lens system 9, the particles emitted from the illumination system 2 are formed into a wide, substantially telecentric particle beam serving as lithography beam lb. The lithography beam lb then irradiates the PD system 3 which is held at a specific position in the path of the lithography beam lb. The PD system 3 comprises a number of plates with a plurality of openings and/or apertures 30, arranged in regular arrays, which define a beam pattern to be projected on the substrate 13.

Some of the apertures and/or openings are "switched on" or "open" so as to be transparent to the incident beam in the sense that they allow the portion of the beam (beamlet) that is transmitted through it to reach the target. The other apertures and/or openings are "switched off" or "closed", in the meaning that the corresponding beamlets cannot reach the target (even though they may leave the PD system and travel through some portion of the projecting system 4); effectively these "switched off" apertures and/or openings are non-transparent (opaque) to the beam. As a consequence, the lithography beam lb is structured into a patterned beam pb, emerging from the PD system 3. The pattern of switched on apertures and/or openings—the only portions of the PD system 3 which are transparent to the lithography beam lb—is chosen according to the pattern to be exposed on the substrate 13. It should be noted that the "switching on/off" of the beamlets usually is realized by a blanking means of a suitable kind provided in one of the plates of the PD system 3: "Switched off" beamlets are deflected off their path (by very small angles) so they cannot reach the target but are merely absorbed somewhere in the lithography apparatus, e.g., by an absorbing plate 10. In FIG. 1 only five beamlets of the patterned beam pb are shown as representatives for an actual large number of beamlets. One of the beamlets is switched off and is absorbed at the absorbing plate 10 while the other four beamlets are directed to the target 13 and there form images of the respective apertures 6.

In the embodiment shown in FIG. 1, the projection system 4 is composed of a number of consecutive particle-optical projector stages, consisting of electrostatic or electromagnetic lenses and other deflection means. These lenses and means are shown in symbolic form only, since their application is well known from prior art. The projection system 4 employs a demagnifying imaging through crossovers c1, c2. The demagnification factor for both stages is chosen such that an overall demagnification of several hundred results, e.g., 200× (FIG. 1 is not to scale). A demagnification of this order is in particular suitable with a lithography setup, in order to alleviate problems of miniaturization in the PD device.

In the whole projection system 4, provisions are made to extensively compensate the lenses and or deflection means with respect to chromatic and geometric aberrations. As a means to shift the image laterally as a whole, i.e., along a direction perpendicular to the optical axis cx, deflection means 11 and 12 are provided in the projection system 4. The deflection means can be realized as, for instance, a multipole electrode system which is either positioned near a crossover, as shown in FIG. 1 with the first deflection means 11, or after the final lens of the respective projector, as in the case with the second stage deflection means 12 in FIG. 1. In this apparatus, a multipole electrode is used as deflection means both for shifting the image in relation to the stage motion and for correction of the imaging system in conjunction with the alignment system. These deflection means 11, 12 are not to be confused with the blanking array means of the PD system 3 which are used to switch selected beamlets of the patterned beam pb "on" or "off", since the former only deal with the particle beam as a whole.

Suitably, a scanning stripe exposure strategy, where the substrate 13 is moved under the incident beam pb, is utilized. It should be noted that, since different parts of the substrate 13 are to be patterned differently, the number of "switched on" apertures can change quickly when the substrate is moved under the patterned beam. At the same time, the current, i.e., the particles traversing the optical column of the lithography apparatus 1 after the absorbing plate 10, may change considerably.

In one typical implementation, the size of the image of an array of apertures in the PD system 3 on the substrate 13 is 80 μm square. The substrate 13 is moved with a velocity of 3 mm/s underneath the patterned beam; so, a completely new area with a—possibly—different pattern is reached every 30 ms. Consequently, the patterns change in a matter of milliseconds, and the optics of the lithography apparatus 1 have to cope with the changing current, i.e., the changing number of particles crossing the optical column.

Grey Scales

According to the PML2 concept the substrate 13 is moved continuously, and the same image element ("pixel") on the target is covered many times by the images of a sequence of apertures during the same scanning movement. Simultaneously, the pattern in the PD system is shifted, step by step, through the apertures of the PD system. Thus, considering one image element at some location on the target, if all apertures are switched on when they cover that image element, this will result in the maximum exposure: a "white" shade corresponding to 100%. In addition to a "white" shade, it is possible to expose an image element at the target according to a grey scale, namely, with an exposure level which would interpolate between a the minimal ('black') and maximal ('white') exposure doses. A grey shade is realized by switching on a corresponding number of apertures in the line, for example, 8 out of 30 apertures. Thus, the signal controlling the value of an image element is represented by a grey scale code, for example an integer number coded as a binary number of n bits. There may be different numbers of grey shades.

Figure 2:
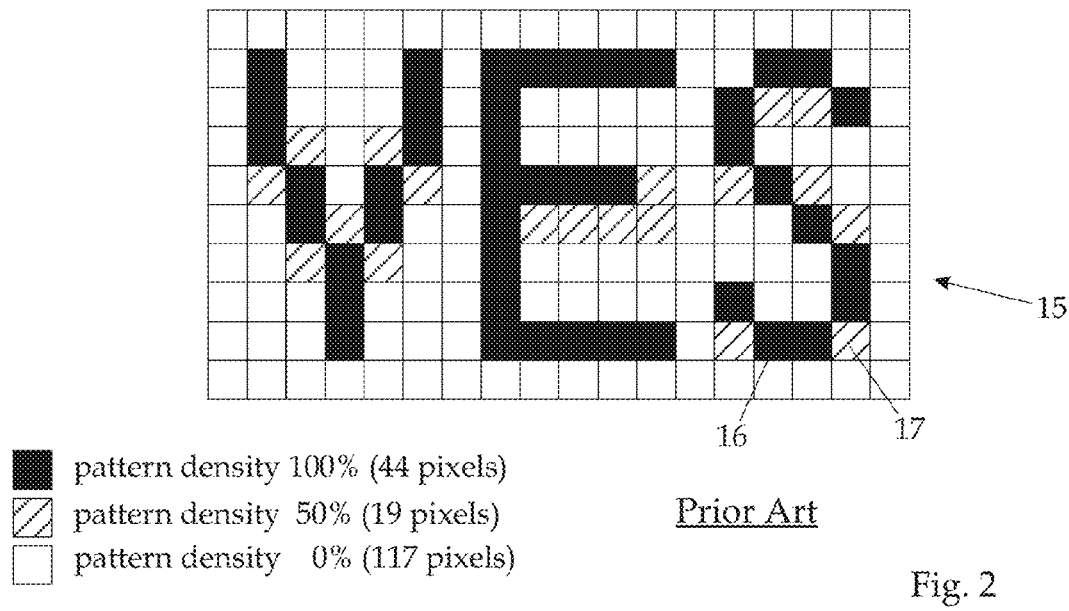
FIG. 2 shows an example of a pixel map of an exemplary layout.

FIG. 2 shows a simple example of an image 15 with a size of 10×18=180 pixels, where some pixels 16 of the exposure area are exposed to a grey level of 100% and other pixels 17 are exposed to only 50% of the full grey level. The remaining pixels are exposed to a 0% dose (not exposed at all). Of course, in a realistic application of the invention, the number of pixels of the standard image would be much higher. However, here the number of pixels is only 180 for the better clarity. Also, more gray levels could be used.

Trotting Mode

Figure 3:
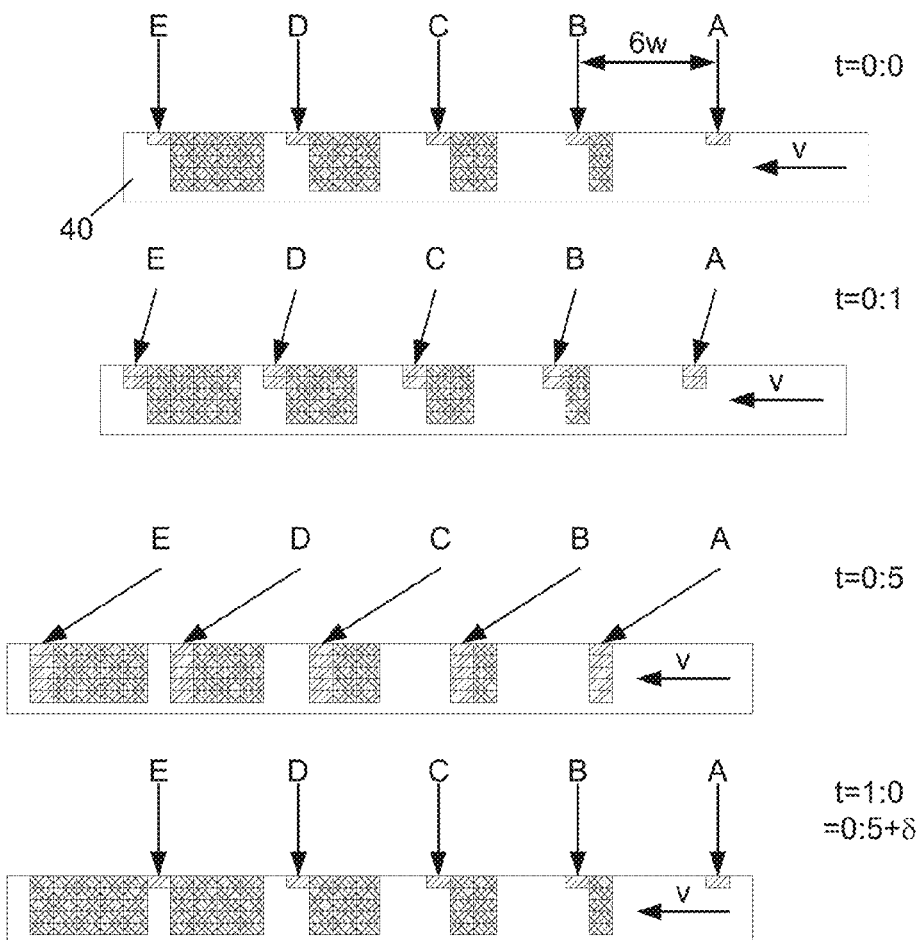
FIG. 3 illustrates a writing strategy according to prior art.

FIG. 3 illustrates the concept of the "trotting" strategy as discussed in US 2008/0237460 A1, on which the present invention is derived. A target 40, for instance a silicon wafer covered with a resist to be exposed, moves with a velocity v, while a number of beamlets (only five beamlets denoted A through E are shown for the sake of clarity) impinges on the target. Each beamlet passes the complete dose for one pixel to the resist during one pixel exposure cycle T1 lapsing between the uppermost and the lowermost frame in FIG. 3. Within the figure, the cross-hatched fields denote pixels that are completely illuminated, while simply hatched fields indicate pixels which are currently exposed and thus are summing up the necessary dose. To simplify the explanation of the method, FIG. 3 does not account for gray scales; rather, in FIG. 3 only full exposures (100% grey scale equivalent to a "white" shade) are shown.

The target is moved with respect to the PD system (which is assumed to remain at a fixed position beyond the top of FIG. 3), but the writing method requires that the location where each beamlet impinges on the target stays locked on the position of a pixel during a respective pixel exposure cycle in spite of that relative movement, even for a movement of the target by a distance covering multiple pixels. As a consequence, the beamlets are deflected accordingly by means of the deflection system of the imaging optics.

The width of a pixel as exposed on the target is denoted w, the distance of two neighboring beamlets is M'w, wherein M' is one more than the number M of beamlets writing in parallel on one line. The factor M+1 is one simple choice to ensure that M and M' are coprime (relatively prime); any other number M' which is coprime to M could be used instead. Such a choice of M' and M will ensure the exposure of adjacent pixels through a run of M' exposure cycles. In the case of the simple example shown in FIG. 3, M=5 and M'=M+1=6. (Remark: In US 2008/0237460 A1 symbols N and N' were used for the parameters designated here as M and M'; neither should be confused with the aperture offset N which is defined below.) Starting from an initial position at the beginning of an exposure cycle, shown in the initial (uppermost) frame at t=0:0, the times are consecutively denoted as t=0:1 where the continuous motion of the target has progressed by one pixel width w, t=0:2 at two pixel widths $2w$ (not shown), and so on. At t=0:5 (t=0:M), the movement will have proceeded to a distance of five (M) pixel widths $5w$, which marks the end of the actual exposure. After that, the beamlets are directed to another set of pixels as shown in the lowermost frame of FIG. 3 to start a next pixel exposure cycle at t=T1=1:0. The latter time, T1=1:0, is a time point shortly after t=0:M; in other words t=0:M+=1:0, where denotes a small time interval used to switch the beamlets.

It should be noted that the inclination of the beamlets in FIG. 3 is largely exaggerated; in a true depiction of a realistic geometry of a wafer process, the angles of inclination would be quite small and seemingly inconspicuous to the human eye. Moreover, it is also possible (by using, for instance, a consecutive set of electrostatic multipoles) to shift the set of beamlets laterally without affecting their orientation; in that case, the angle of inclination would not change at all. Also, the range of deflection may suitably be chosen to be symmetric around the z-axis.

In the above description, all pixels were assumed to be fully exposed to a 100% gray value. In a realistic case, of course, each pixel is attributed an individual gray value as dictated by the pattern to be exposed. Thus, when grey-scales are included, some beamlets are switched off in some of the exposure steps depicted, and the deposited doses would differ according to the grey scale from one pixel to the next. The on/off-switching of every beamlet blanker in the PD system is controlled according to the programmed pattern, during each pixel exposure cycle. For example, if one pixel which is illuminated by its corresponding beamlet is to receive a dose of 25% of the maximum value, the blanker for that beamlet has to be opened for 25% of the pixel exposure cycle covering that pixel.

Placement Grids

In the trotting mode method as explained above the direction of advance of the beamlets (beamlets A to E in FIG. 3) on the target is linear and parallel to a line of apertures (as realized when projected onto the target). This is acceptable when the apertures are arranged on the aperture array of the PD system in an arrangement where each line comprises apertures, such as the staggered-line arrangement as shown in FIGS. 2 and 3 of U.S. Pat. No. 6,768,125. However, a simple arrangement where the apertures/beamlets are aligned according to a rectangular grid with the direction of advance running parallel to one of the axes of the rectangular grid would not work with the linear trotting mode method since then the spaces between the lines of apertures will not be covered by beamlets.

While in the trotting mode method the deflection of the beams remains the same for every pixel exposure and takes only into account the stage movement during the pixel exposure, this is not the case with the method modified according to the invention. The "intelligence" of the method is partly determined by the layout of the aperture plate, where it is required that M' and M are coprime as illustrated in the section before. The modification of the trotting mode requires that M' (i.e., $(No)^2$ for the method as described below) is an integer multiple of M (i.e., M for the method as described below). A simplification of the aperture arrangement in the PD system is compensated by a more complex scheme of beam deflection, so the "intelligence" of the trotting mode exposure is moved into the beam deflection units. Thus, a sequence of pixels is exposed with a sequence of different deflection settings which not only take into account the stage movement but also the relative position between the pixels.

Figure 4:
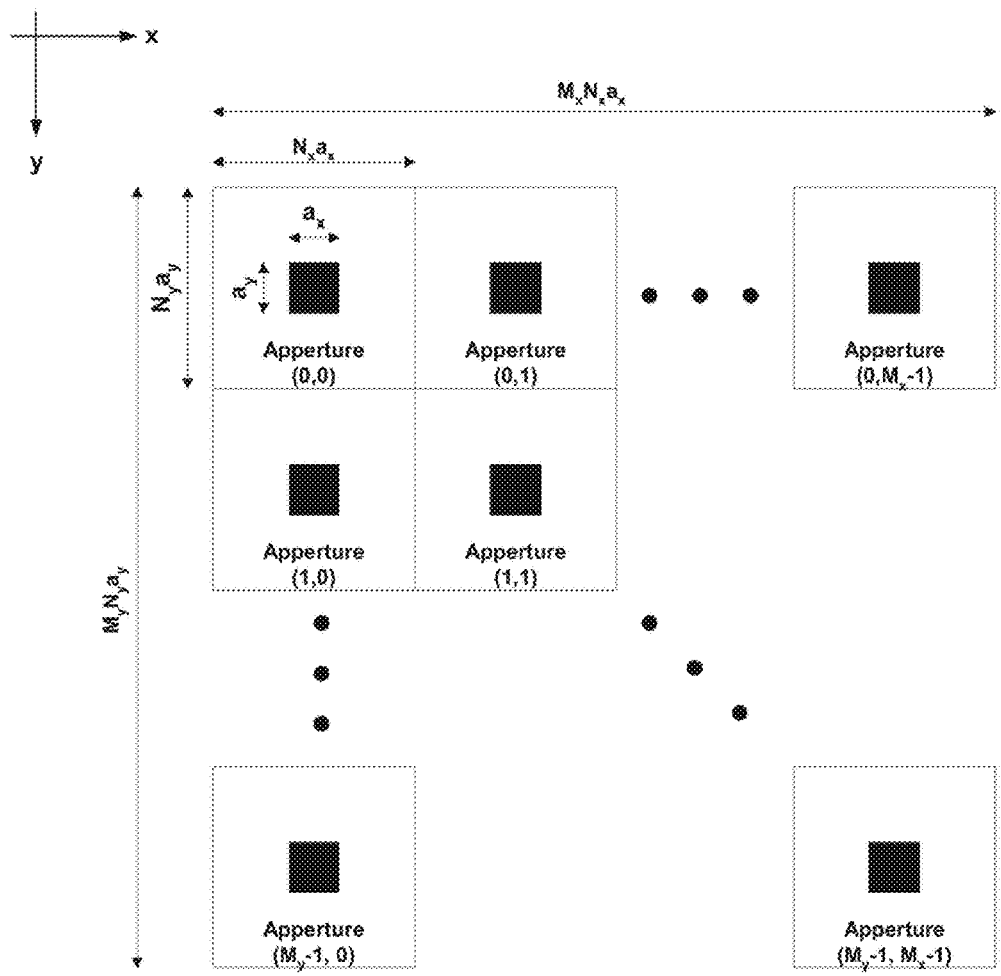
FIG. 4 shows an arrangement of apertures used according to the invention.

FIG. 4 illustrates one example of a simplified arrangement of apertures. Shown is the arrangement of the aperture images as projected onto the target. The arrangement in the aperture array of the PD system is the same, however, enlarged by the inverse of the reduction ratio (RR) of the optical system. The main axes X and Y correspond to the direction of advance of the target motion and the perpendicular direction, respectively. Each aperture has widths $a_x$ and $a_y$ along the directions X and Y respectively. The apertures are arranged along lines and rows having $M_x$ and $M_y$ apertures, respectively, with the offset between neighboring apertures in a line and row being $N_x$ and $N_y$ respectively. As a consequence, to each aperture belongs a conceptual cell having an area of $N_x a_x \times N_y a_y$, and the aperture arrangement contains $M_x M_y$ cells arranged in a rectangular way.

In the discussion hereinafter, we will assume a square grid as a special case of a rectangular grid, and set $a=a_x=a_y$, $N=N_x=N_y$, and $M=M_x=M_y$ with M being an integer, for all further explanations without any restriction of the generality.

The distance between two neighboring exposure positions is denoted as e in the following. In general, the distance e can be different from the width a of a pixel. In the simplest case, a=e. In another interesting case (cf. U.S. Pat. No. 7,276,714), e can be a fraction a/o of the pixel width a, with o>1 being an integer which we also refer to as the oversampling factor. In this case the pixels will overlap, allowing a higher resolution of the pattern to be developed.

We can calculate that the aperture images comprise $(NMo)^2$ image elements ("pixels"; it is reminded that the pixels may overlap if o>1). At the same time $M^2$ beamlets are available to expose this area, thus every beamlet has to expose $(No)^2$ pixels in successive exposure steps. Using a moving substrate these $(No)^2$ exposures steps have to be performed during the time L/v within which the substrate moves by a distance L=NMa corresponding to the width of the aperture image generated on the target.

We now define a "placement grid". For this, we first regard the positions of the beamlets on the target, which form a regular array as defined by the aperture array in the PD system. The array of beamlet positions is extended to all sides so as to extend over the entire die area on the target. This gives a regular array of positions which corresponds to the set of pixel positions that can be reached under the condition that the array of beamlets is allowed to move only by grid vectors that correspond to the regular array of beamlets. A "placement grid" is a set of all image elements whose relative positions correspond to such an array. From the above it is obvious that there are $(No)^2$ placement grids. Within any area on the target that is within the bounds of the patterned beam pb, it is possible to expose the image elements within a given placement grid simultaneously by the beamlets of the PD system.

The individual placement grids (or equivalently, the individual pixel positions within a cell) can be labeled by an index g that takes values from 1 to $g_{max}=(No)^2$. Each value of the index g corresponds to one respective placement grid, and by counting through the index g one can cycle through the sequence of different placement grids.

Figure 5:
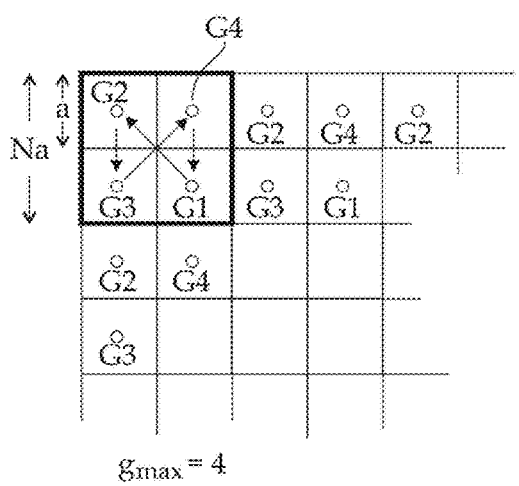
FIG. 5 shows an example of placement grids.

FIG. 5 illustrates an example of placement grids for the simple case N=2 and o=1. In each cell there are $g_{max}=4$ pixel positions associated with one of placement grids G1, G2, G3, G4, respectively.

Figure 6:
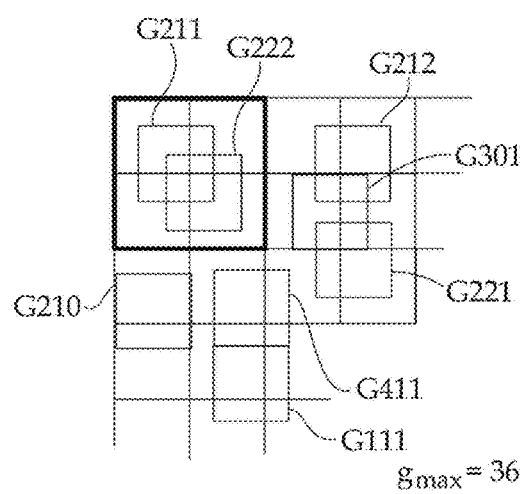
FIG. 6 illustrates another example of placement grids with interlocking grids.

FIG. 6 depicts a more involved case, N=2 and o=3. Only some of the possible placement grids Ggij (with g=1, . . . , $g_{max}$, and i,j=0, . . . , o−1) are shown, and only one exemplary pixel position is shown in each case; this simplification is necessary since the total number of placement grids is 36, so a complete depiction would be unintelligible.

Figure 7:
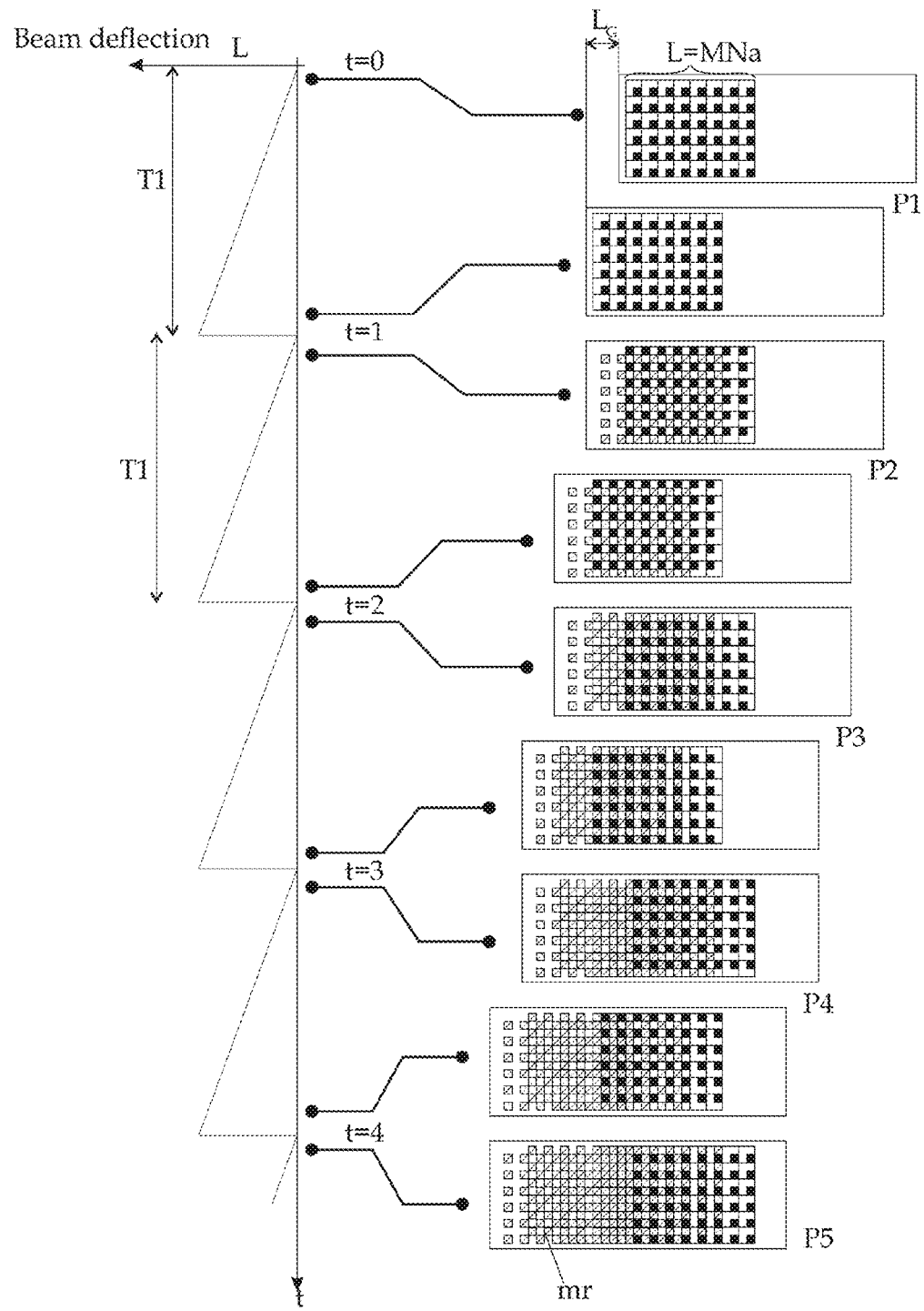
FIG. 7 shows the exposure scheme of the pixels according to the invention.

FIG. 7 shows the exposure scheme of the pixels according to the invention. Shown is a sequence of frames, with increasing time from top (earlier) to bottom (later). The parameter values in this figure are o=1, N=2; also, a rectangular beam array is assumed with $M_x=8$ and $M_y=6$. The target moves continuously to the left, whereas the beam deflection is controlled with a seesaw function as shown on the left side of the figure. During each time interval of length T1, the beam image stays fixed on a position on the target. Thus, the beam image is shown to go through a sequence of positions P1, P2, P3, P4, P5. Positions P1 to P4 correspond to suitable positions in placement grids G1 to G4, respectively (also see FIG. 8); position P5 represents the start of a new cycle within grid G1, but with an additional longitudinal offset L.

As already mentioned, one cycle of placement grids is exposed within a time interval. L/v=NMa/v. Therefore, each placement grid takes $1/g_{max}$ of that time interval. This time corresponds to a length by virtue of the target motion, $L_G = v \cdot T1 = L/(No)^2 = aM/(No^2)$, which we call "exposure length".

Figure 8:
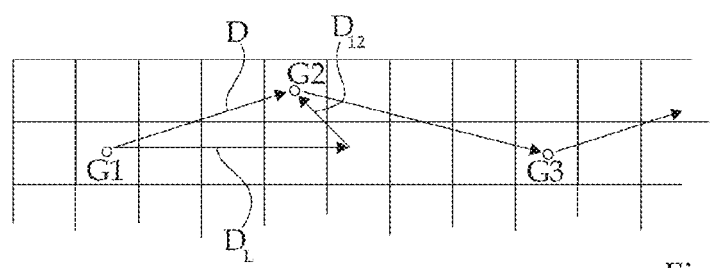
FIG. 8 is a detail with the sequence of placement grids as used in FIG. 7.

The beamlets are moved over the distance of $L_G$ during the exposure of a set of image elements belonging to a given value of the index g together with the target. In other words, all beamlets maintain a fixed position with regard to the surface of the substrate during the time interval T1. After moving the beamlets with the target along a distance $L_G$, the beamlets are relocated instantaneously (within a very short time) to start the exposure of the image elements of the next placement grid, which would have index value g+1 (more accurately, (g+1) modulo (No)$^2$). Referring to FIG. 8, the relocation is composed of a first component $D_L$ along the X direction (this component has length $L_G$, but oriented in the opposite direction) as well as a second component $D_{12}$ required to switch between the positions of the consecutive placement grids, in the case shown (FIG. 8) placement grids G1 and G2. The main component $D_L$ effectively compensates the movement of the beamlets with respect to the PD device by the distance $L_G$. The second component $D_{12}$ is the offset between the positions within a cell and can take generally any direction within the X-Y-plane, depending on how the exposure positions are located as a function of the index g.

The exposure length $L_G$ is, in general, given by the above formula. Preferably, the values of the parameters M, N and o are chosen such that $L_G$ is an integer multiple of the width a of a pixel. In this case, the second component $D_{12}$ of the offset between positions is calculated in a straightforward manner from the relative positions of the respective placement grids G1, G2; otherwise, additional corrections to account for the fractional part of $D_L = -L_G$ should be taken into account.

After a full cycle through the placement grids G1 ... G4, the sequence starts anew. It will be clear from the above and FIGS. 7 and 8, that with the completion of a full cycle of placement grids, the overall displacement is parallel to the X direction (scanning direction) and has an accumulated length of $L = g_{max} L_G$, while the perpendicular components of the individual offsets cancel out mutually.

With this method it is possible to write stripes of arbitrary length, exposing all pixels by cycling iteratively through the placement grids. This is equivalent to counting the index g going from 1 to $g_{max} = (No)^2$, and repeat as often as necessary. At the beginning and at the end of the stripe the exposure method may not produce a contiguous covering, so there is a margin mr (FIG. 7) of length L that is not completely filled.

The present invention allows employing an APS setup with a simpler and more generic arrangement of the apertures. With the simplified arrangement it is also possible to substitute an aperture array plate with another aperture array plate having different size and/or shape of the apertures while the other components of the PD system, in particular the plate realizing the blanking array means, remains unchanged.

Perpendicular Redundancy

The method according to the invention advantageously makes possible an additional redundancy concept that allows reducing the influence of always open and always closed failures on the blanking array component of the PD device. Previous redundancy concepts have suggested to distribute redundant information along the axis in write direction. In contrast, this aspect of the invention introduces an approach that distributes the redundant information perpendicular to the write direction. This approach can be implemented very efficiently with hardware as described in US 2008/0237460 A1.

Figure 9:
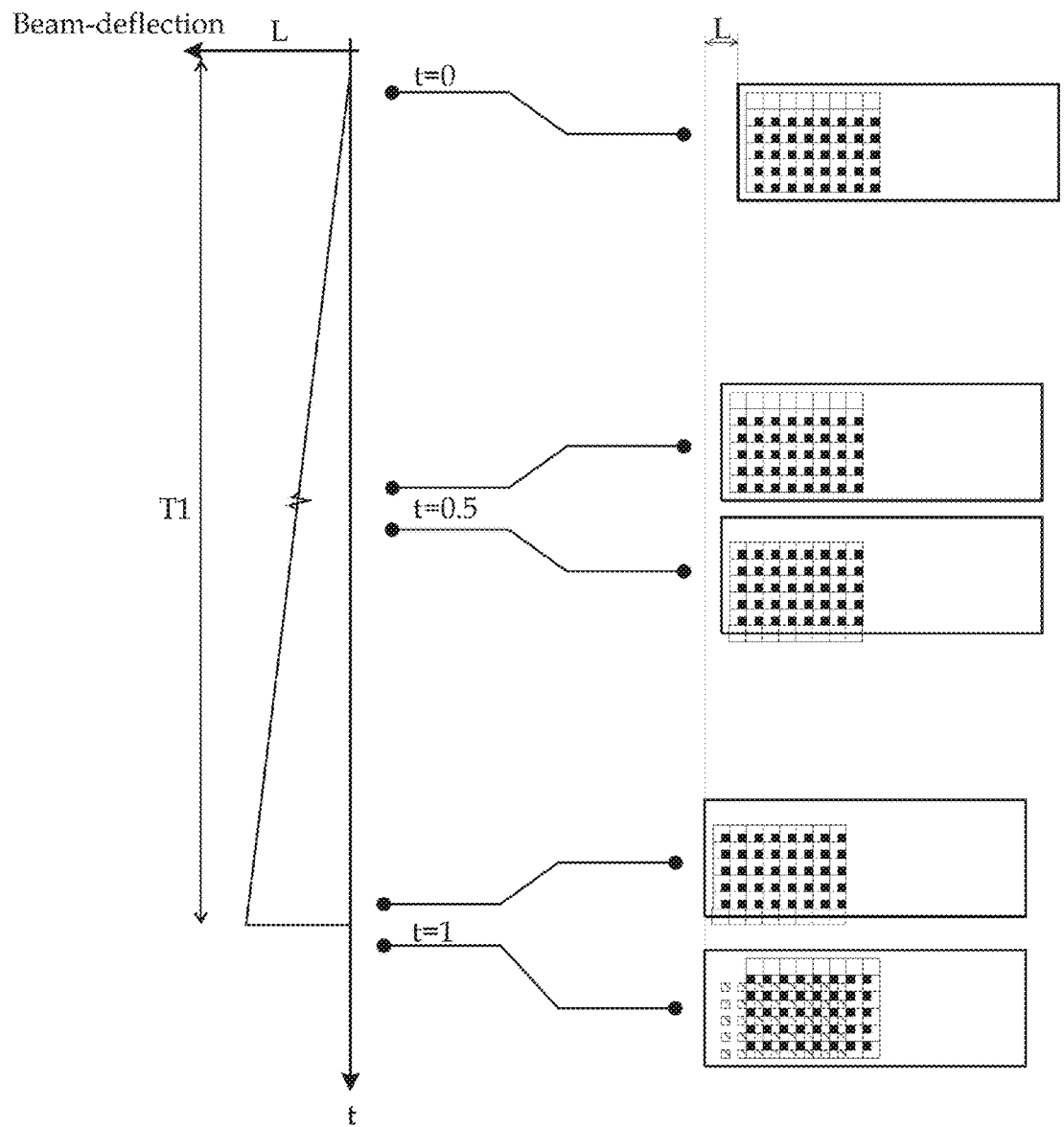
FIG. 9 illustrates a redundancy concept involving apertures along the direction perpendicular to the scanning motion of the target.

FIG. 9 illustrates this redundancy concept. The redundancy scheme is based on the concept that a number r of apertures that are arranged perpendicular to the scanning direction carry redundant information. The number r, which is referred to as "redundancy ratio", may be any integer r>1, for instance r=2, 4, 8, ... or another binary power $2^R$. In FIG. 9, r=2, and the other parameters are the same as in FIG. 7; only one time interval $T1 = L_G/v$ is depicted.

According to this redundancy concept, the interval T1 is further divided into r subintervals. After each interval T1/r (equivalent to a distance $L_G/r$) the beamlets are moved so as to expose pixels of the same placement grid (same index g), but with different placement as taken along the Y direction. Thus, the beamlets now expose pixels that were exposed by different apertures in the same column. After a complete interval corresponding to $L_G$, every image element within the beam image has been exposed by r different apertures. These r different apertures are all located in the same column.

In the case r=1 we recover the method as described above (FIG. 7) without redundancy.

In case of writing single stripes this implementation of redundancy may require the stripe to be reduced by r−1 lines of apertures. If stripes are stitched, an overlapping area of stripes can be defined.

The invention provides for a method by which it is possible to expose an entire die field on the target in a contiguous manner without additional scanning of the beam in other directions as specified above (except, where needed, to compensate for lateral travel motion errors of the target stage).

Grey Level Dithering

With interlocking grids (o>1) it is possible to increase the number of gray levels by "dithering" while dose distribution remains homogeneous. The basis for this is that the grey levels on any nominal grid are equal. This means that for the double interlocking grid the number of dose levels that can be realized is four times higher than for the non-interlocking grid.

Generally speaking any oversampled exposure grid (i.e., o>1) consists of up to $o^2$ nominal grids shifted by distances a/o in X and Y direction. So the step from one dose level to the next can be divided into o sub-steps where the dose level of only one of these o grids is increased until all sub-grids expose the nominal level.

The beam shape at the substrate is known to be the convolution of the machine blur and the reduced aperture shape of the aperture plate. It is possible to obtain a homogeneous dose distribution on the substrate if a is set to a natural multiple of the exposure grid constant e; in other words, if o=a/e is an integer. Otherwise the dose distribution may have minima and maxima with a periodicity the exposure grid, by virtue of aliasing effects. A high number of gray levels allows better feature placement. Therefore increasing the gray levels is of relevance if the gray levels per pixel position are limited to a certain number.

Predistortion Calculation of the Aperture Plate

The optical system produces image distortions which will have to be compensated. One possible way of compensation for these errors is to recalculate the rasterised image data. In principle it is possible to interpolate to a certain position with order that corresponds to number of neighboring pixels available in one dimension. In case of o≧2 a simple linear interpolation will produce sufficient accuracy.

Therefore, the compensation method may include an upsampling of the image data, wherein the additional points are interpolated of order 1 or higher. The upsampling ratio is chosen in a way that the distance between the upsampled points is less than the accuracy requirements on the edge positioning. After upsampling the image is downsampled again, using only those image points that fit to the grid on the target which, after projection, will deviate from the ideal rectangular and uniformly spaced grid.

Calculation of Bitmaps for Aperture On/Off Errors

One important category of defect is that an aperture cannot be switched on and off, but rather is always in a switched-on or switched-off state; this is called aperture-on error or aperture-off error, respectively. For a given PD system, the location of apertures with such an error can be determined, resulting in a so-called failure map. During data preparation it is then possible to use oversampled grids (o>1) to partly compensate for these errors. Of course, to allow an efficient correction the defective apertures should be located widely spaced, that is, they should not influence each other.

The method to achieve the compensation is to maintain the DTC point at the same position by adding (always closed failure) respectively subtracting (always open failure) the necessary dose with the neighboring pixels. Note that it is necessary that the neighboring pixels always have to be written with different apertures, otherwise also the neighboring pixels would have a faulty behavior. The trotting mode as described above fulfills this requirement.

Figure 10:
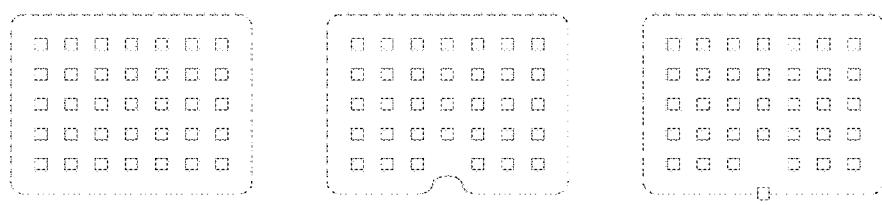
FIG. 10 illustrates an aperture-off error and a way to compensate this error.

This process is illustrated in FIG. 10 with an aperture-off error. In the left-hand image the nominal operation is drawn, the squares indicate the center of the exposed pixels and the dashed line shows the DTC. In the middle image the case of on aperture being always closed is drawn, showing that the DTC (and thus the resist image) shows an unwanted line edge artifact. The right-hand image shows that the artifact can be strongly reduced or effectively suppressed by exposing the pixel below the always closed fault. With this method the DTC line can be "pushed" back to its nominal position.

The calculation of the corrected exposure bitmap can be performed during or after rasterization by use of aperture plate defect maps. The compensation is only necessary at feature edges, as defects that occur away from feature borders are effectively compensated by the oversampled grid.

We claim:

1. A method for forming a pattern on a surface of a target by means of a beam of electrically charged particles, the method comprising:
producing said particle beam;
directing said particle beam through a pattern definition means comprising an aperture array having a plurality of regularly arranged apertures of identical shape, thus producing a number of beamlets by means of said apertures which define the shape and relative position of said beamlets, and modifying selected beamlets by means of a blanking array means of the pattern definition means towards respective paths which do not meet the target, thus effectively switching off the passage of said selected beamlets, the remaining beamlets forming, as a whole, a patterned particle beam;
projecting said patterned particle beam by means of an optical column comprising a controllable deflection means onto said target surface to form a beam image composed of the images of the apertures whose beamlets are not switched off, each aperture corresponding to an image element on the target surface, while the target is moving relative to the pattern definition means along a scanning direction within an image plane in which the images of apertures are formed,
wherein during a sequence of uniformly timed exposure steps the location of said beam image is, by means of said controllable deflection means, moved along with the target at least with respect to the relative target movement along the scanning direction, and between exposure steps the location of the beam image is changed with respect to the target,
the exposure steps having a duration within which the relative movement of the target covers a uniform distance of advance which is greater than the mutual distance of neighboring image elements on the target,
wherein at consecutive exposure steps the beam image is located at image positions which each correspond to a position on one of a set of regular placement grids, said placement grids being congruent and identically oriented but each having a different placement offset within the image plane, the placement offset between any two placement grids being not greater than the mutual distance of neighboring image elements on the target, at least some of the placement offsets being oblique or perpendicular to the scanning direction,
wherein with each change of location of the beam image between exposure steps, the beam image is shifted to an image position associated with a different placement grid, thus cycling through the set of placement grids, said change of location additionally comprising a longitudinal component which is generally uniform,
said longitudinal component being parallel to the scanning direction and having a length which is a fraction of the width of the beam image as measured along the scanning direction and generally compensating the movement of the location of the beam image between consecutive exposure steps with regard to the location of the pattern definition means.

2. The method according to claim 1, wherein within an exposure step, the location of the beam image is changed between locations belonging to the same replacement grid.

3. The method according to claim 2, wherein the changes of location within an exposure step are done at regular time intervals, shifting the location of the beam to a location different from the previous locations in the respective exposure step.

4. The method according to claim 3, wherein the changes of location within an exposure step are done perpendicular to the scanning direction.

5. The method according to claim 2, wherein the changes of location within an exposure step are done perpendicular to the scanning direction.

6. The method according to any one of the preceding claims, wherein the regular arrangement of the apertures in the pattern definition means comprises lines of apertures running parallel to the scanning direction, and neighboring lines of apertures are offset from each other by an offset greater that the width of the apertures taken perpendicular to the scanning direction.

7. The method according to any one of the preceding claims, wherein the arrangement of each placement grid geometrically corresponds with the regular arrangement of the apertures in the pattern definition means as projected onto the target, and within each exposure step the images of the apertures positionally coincide with a portion of one of said placement grids.

8. The method according to any one of the preceding claims, wherein the sum of consecutive changes of location of the beam image, summed over one cycle through said set of placement grids, is parallel to the scanning direction.

9. The method according to any one of the preceding claims, wherein the distance of advance is greater than the mutual distance of neighboring aperture images on the target as taken along the scanning direction.

* * * * *